(12) United States Patent
Maejima

(10) Patent No.: US 9,245,628 B2
(45) Date of Patent: Jan. 26, 2016

(54) NON-VOLATILE SEMICONDUCTOR MEMORY DEVICE

(75) Inventor: Hiroshi Maejima, Setagaya-ku (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 1 day.

(21) Appl. No.: 13/595,478

(22) Filed: Aug. 27, 2012

(65) Prior Publication Data

US 2013/0088918 A1    Apr. 11, 2013

(30) Foreign Application Priority Data

Oct. 6, 2011    (JP) ................................. 2011-221500

(51) Int. Cl.
*G11C 11/34* (2006.01)
*G11C 16/04* (2006.01)
*G11C 16/26* (2006.01)

(52) U.S. Cl.
CPC ............ *G11C 16/0483* (2013.01); *G11C 16/26* (2013.01)

(58) Field of Classification Search
USPC ..................................................... 365/185.11
See application file for complete search history.

(56) References Cited

U.S. PATENT DOCUMENTS

| 7,663,932 | B2 * | 2/2010 | Hamada | G11C 16/34 365/185.25 |
| 7,940,572 | B2 * | 5/2011 | Kim | G11C 16/16 365/185.18 |
| 8,542,533 | B2 | 9/2013 | Maejima et al. | |
| 2006/0198196 | A1 * | 9/2006 | Abe | G11C 16/0483 365/185.18 |
| 2006/0279995 | A1 * | 12/2006 | Matsuda | G11C 8/08 365/185.18 |
| 2007/0158731 | A1 * | 7/2007 | Bae | G11C 11/22 257/314 |
| 2008/0232183 | A1 * | 9/2008 | Maejima | H01L 27/0203 365/205 |
| 2009/0273976 | A1 * | 11/2009 | Maejima | G11C 11/5642 365/185.05 |
| 2010/0195383 | A1 * | 8/2010 | Damle | G11C 16/0483 365/185.02 |
| 2013/0229875 | A1 * | 9/2013 | La Rosa | H01L 29/7881 365/185.21 |
| 2013/0250700 | A1 * | 9/2013 | La Rosa | H01L 29/788 365/185.29 |
| 2013/0336062 | A1 | 12/2013 | Maejima et al. | |

FOREIGN PATENT DOCUMENTS

| JP | 2010-129772 | 6/2010 |
| JP | 2013-004123 A | 1/2013 |

* cited by examiner

*Primary Examiner* — Hoai V Ho
*Assistant Examiner* — Pablo Huerta
(74) *Attorney, Agent, or Firm* — Oblon, McClelland, Maier & Neustadt, L.L.P.

(57) ABSTRACT

A non-volatile semiconductor memory device includes a semiconductor layer of a first conductivity type, and a plurality of wells of a second conductivity type formed on the first semiconductor layer, the wells being arranged in a first direction. A memory block is arranged in each well. A plurality of word lines are provided, each word line being commonly connected to a plurality of NAND cell units in one memory block. A plurality of bit lines extend in a first direction, the bit lines being connected to first ends of the NAND cell units present in the memory blocks. A source line is connected to second ends of the NAND cell units. A well driver performs a control of selectively providing a first voltage or a second voltage higher than the first voltage to each well.

11 Claims, 6 Drawing Sheets

NON-VOLATILE SEMICONDUCTOR MEMORY DEVICE

CROSS REFERENCE TO RELATED APPLICATIONS

This application is based on and claims the benefit of priority from prior Japanese Patent Application No. 2011-221500, filed on Oct. 6, 2011, the entire contents of which are incorporated herein by reference.

FIELD

The embodiments described in the present specification relate to a non-volatile semiconductor memory device.

BACKGROUND

A NAND flash memory is widely known as a semiconductor memory device that can store data in a non-volatile manner and provide high storage capacity. The NAND flash memory has a cell array that includes an arrangement of NAND cell units, each NAND cell unit including a plurality of memory cells connected in series.

The NAND flash memory reads data stored in the memory cell by determining whether a current flows from a bit line to a source line side via the NAND cell unit. In this case, a leak current may flow from the bit line to a well in which the NAND cell unit is formed, thus generating false reading during the read operation.

DETAILED DESCRIPTION

Figure 1:
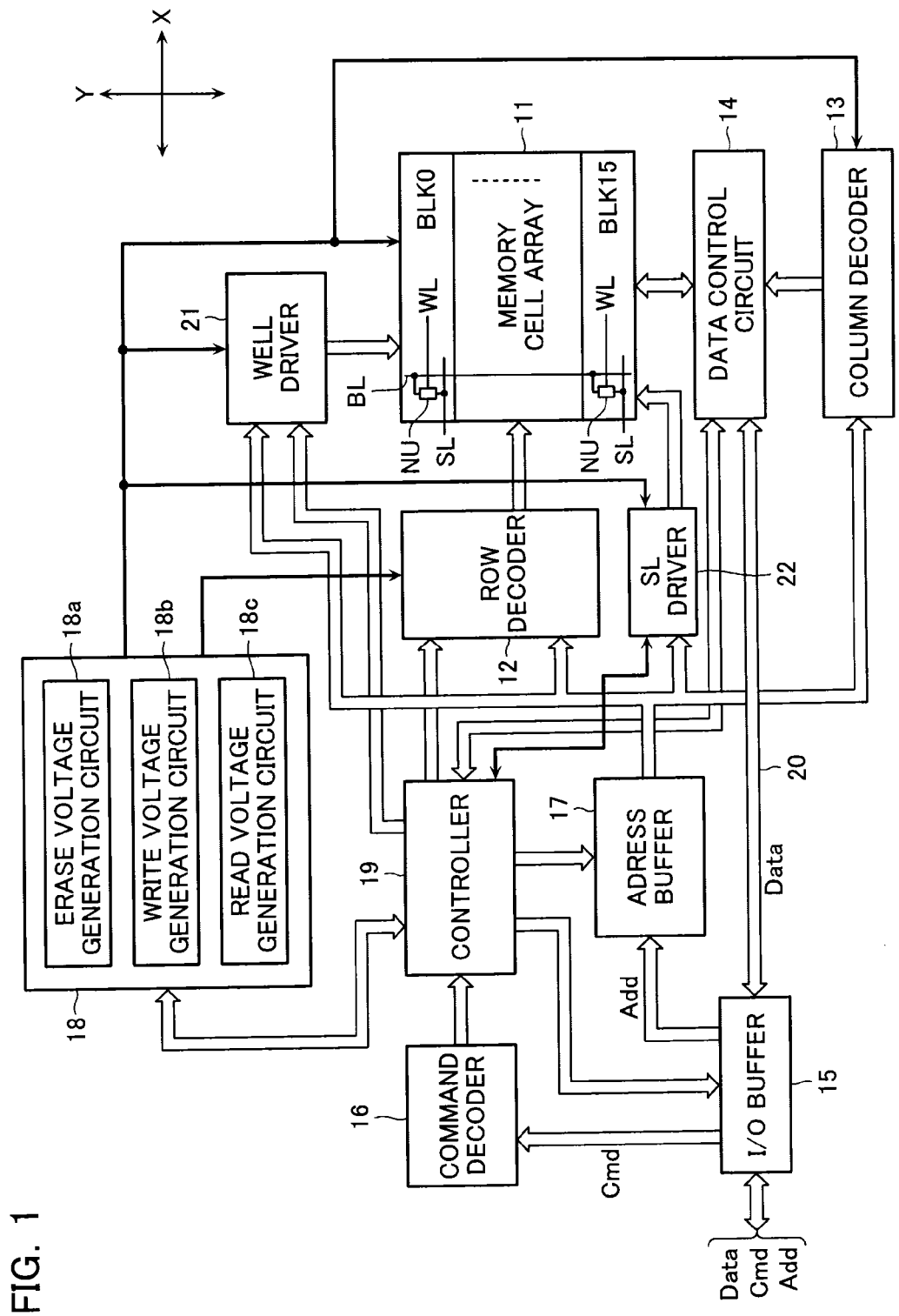
FIG. 1 is a block diagram showing a schematic configuration of a NAND flash memory according to an embodiment.

A non-volatile semiconductor memory device according to the embodiments described below includes a semiconductor layer of a first conductivity type, and a plurality of wells of a second conductivity type formed on the first semiconductor layer, the wells being arranged in a first direction. A plurality of memory blocks are arranged in each of the wells. Each memory block includes a plurality of NAND cell units arranged therein, each NAND cell unit including a plurality of memory cells and select transistors connected in series. A plurality of word lines are provided, each word line being commonly connected to the NAND cell units in one memory block.

A plurality of bit lines extend in the first direction, each bit line being connected to first ends of the NAND cell units present in the memory blocks. A source line is connected to second ends of the NAND cell units present in the memory blocks. A well driver performs a control of selectively applying a first voltage or a second voltage higher than the first voltage to each well.

Referring now to the drawings, a NAND flash memory according to an embodiment of this invention will be described.

FIG. 1 is a block diagram showing a schematic configuration of a NAND flash memory. The NAND flash memory includes a memory cell array 11 including an arrangement of non-volatile memory cells, a row decoder 12 including a word line driver, a column decoder 13, and a data control circuit 14.

The memory cell array 11 includes a plurality of memory blocks BLK arranged in the y-direction. Here, by way of example, a memory cell array 11 will be described that includes 16 memory blocks BLK0 to BLK15. However, it does not mean that the number is limited to 16.

An address Add is captured by an address buffer 17 via an input/output buffer 15. A row address and a column address are transferred to the row decoder 12 and the column decoder 13, respectively. A command Cmd is sent to a command decoder 16 via the input/output buffer 15. The command Cmd is decoded by the command decoder 16 and is sent to a controller 19 where the command Cmd is subject to an operation control. The data Data is transferred between the data control circuit 14 and the exterior via the input/output buffer 15 and via the data bus 20.

The data control circuit 14 includes a sense amplifier circuit that senses and amplifies data read from the memory cells in the memory cell array 11. When writing, the data control circuit 14 temporarily stores write data supplied from the data input/output buffer 15 and performs a bit line voltage control. The row decoder 12 decodes a row address signal supplied from the address buffer 17 to selectively drive the word lines of the memory cell array 11. The column decoder 13 decodes a column address signal supplied from the address buffer 17 to select the bit lines of the memory cell array 11.

The controller 19 controls components such as the data control circuit 14 to perform the read control and the sequence control of the write and erase of the memory cell array 11. An internal voltage generation circuit 18 is provided for generating various internal voltages depending on the operation mode of the read, write, and erase.

Specifically, the internal voltage generation circuit 18 includes an erase voltage generation circuit 18a, a write voltage generation circuit 18b, a read voltage generation circuit 18c, and other various booster circuits. The internal generation circuit 18 is controlled by the controller 19 according to the command Cmd to generate and supply voltages for the various operations.

A well driver 21 has a function of providing voltages to a P-type well in which the memory blocks BLK0 to BLK15 are formed, an N-type well in which the P-type well is formed, and furthermore a P-type semiconductor substrate in which the N-type well is formed. A source line driver 22 has a function of providing a voltage to a source line SL.

Figure 2:
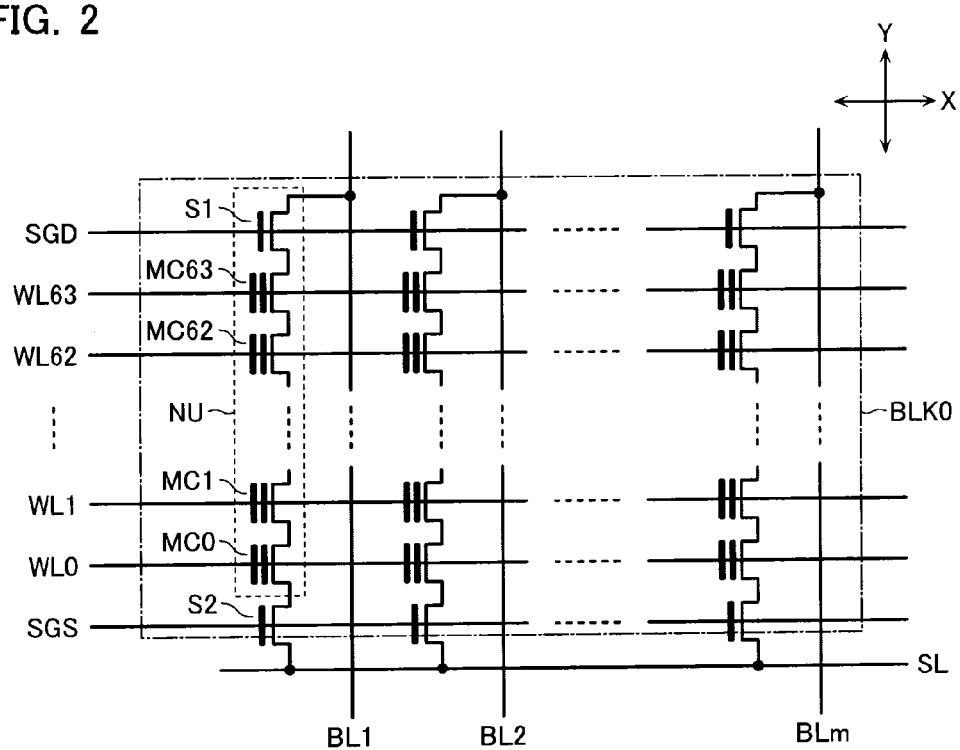
FIG. 2 is an equivalent circuit diagram of one memory block BLK.

FIG. 2 is a circuit diagram showing a configuration of one memory block BLK0. Each memory block BLK includes a plurality of NAND cell units NU arranged in the x-direction. Further, each memory block BLK includes an arrangement of a word line WL, select gate lines SGD and SGS, a bit line BL, a source line SL, and the like.

Each NAND cell unit NU includes a memory string, the memory string including a plurality of non-volatile memory cells MC connected in series, and a drain-side select transistor S1 and a source-side select transistor S2 connected to the respective ends of the memory string. FIG. 2 shows an example where one NAND cell unit NU includes 64 memory cells MC0 to MC63 and the select transistors S1 and S2 connected in series, but this is only by way of example. Each memory cell MC has a MOS transistor structure including, on a channel region, a stack including a gate-insulating film (a tunnel insulating film), a floating gate, an inter-gate dielectric film, and a control gate. The floating gate may be replaced with an insulating film (for example, a silicon nitride film) having a charge accumulation function.

The drain-side select gate line SGD is commonly connected to the gates of m (m is a positive integer) drain-side select transistors S1 arranged in the x-direction. The source-side select gate line SGS is commonly connected to the gates of m source-side select transistors S2 arranged in the x-direction. A first end (such as the drain-side select transistor S1) of the NAND cell unit NU is connected to the bit line BL. A second end (such as the source-side select transistor S2) of the NAND cell unit NU is connected to the source line SL. A set of NAND strings NU arranged in the x-direction form the memory block, which is a unit of data erase. In this embodiment, a plurality of blocks BLK are formed in one P-type well, as described below.

Figure 3:
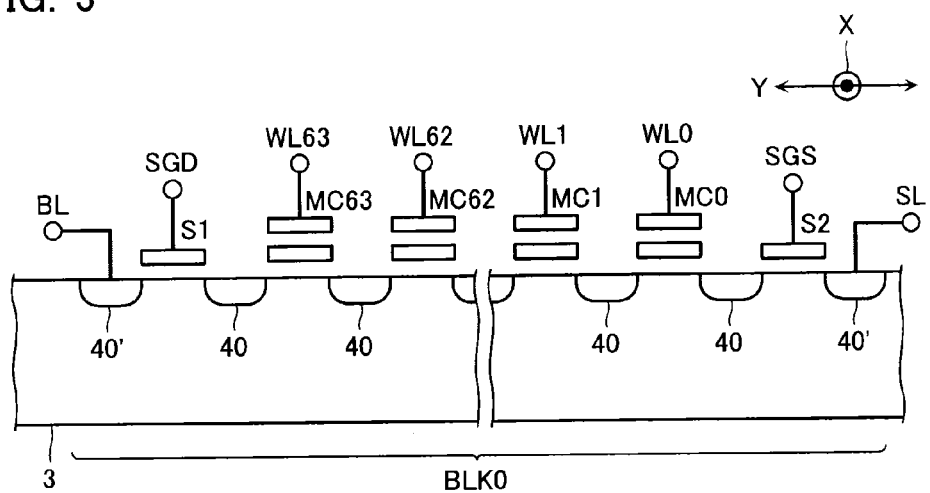
FIG. 3 is a schematic cross-sectional view of one NAND cell unit NU.

FIG. 3 is a schematic cross-sectional view of one NAND cell unit NU along the y-direction. The NAND cell unit NU includes a memory string, the memory string including, for example, 64 memory cells MC0 to MC63 connected in series, and the drain-side select transistor S1 and the source-side select transistor S2 connected to the respective ends of the memory string. Each two adjacent cells of the memory cells MC0 to MC63 share an N-type impurity diffusion layer 40 on a P-type well 3. The layer 40 functions as the drain and source of the memory transistor. Each memory cell MC includes a gate-insulating film formed between two N-type impurity diffusion layers 40, a floating gate formed on the gate-insulating film, an inter-gate dielectric film formed on the floating gate, and a control gate formed on the inter-gate dielectric film. Each word line WL is formed in a direction (the x-direction) perpendicular to the plane of FIG. 3 as the longitudinal direction. Each word line WL commonly connects the control gates of the memory cells MC adjacent in the x-direction of FIG. 2.

Furthermore, each of the drain-side select transistor S1 and the source-side select transistor S2 includes a gate-insulating film formed between the N-type impurity diffusion layers 40 and 40' and a gate electrode formed on the gate-insulating film. The drain-side select gate line SGD and the source-side select gate line SGS are formed extending in a direction (the x-direction) perpendicular to the plane as the longitudinal direction. The drain-side select gate line SGD commonly connects the gate electrodes of the drain-side select transistors S1 adjacent in the x-direction in FIG. 2. Likewise, the source-side select gate line SGS commonly connects the gate electrodes of the source-side select transistors S2 adjacent in the x-direction in FIG. 2.

Figure 4:
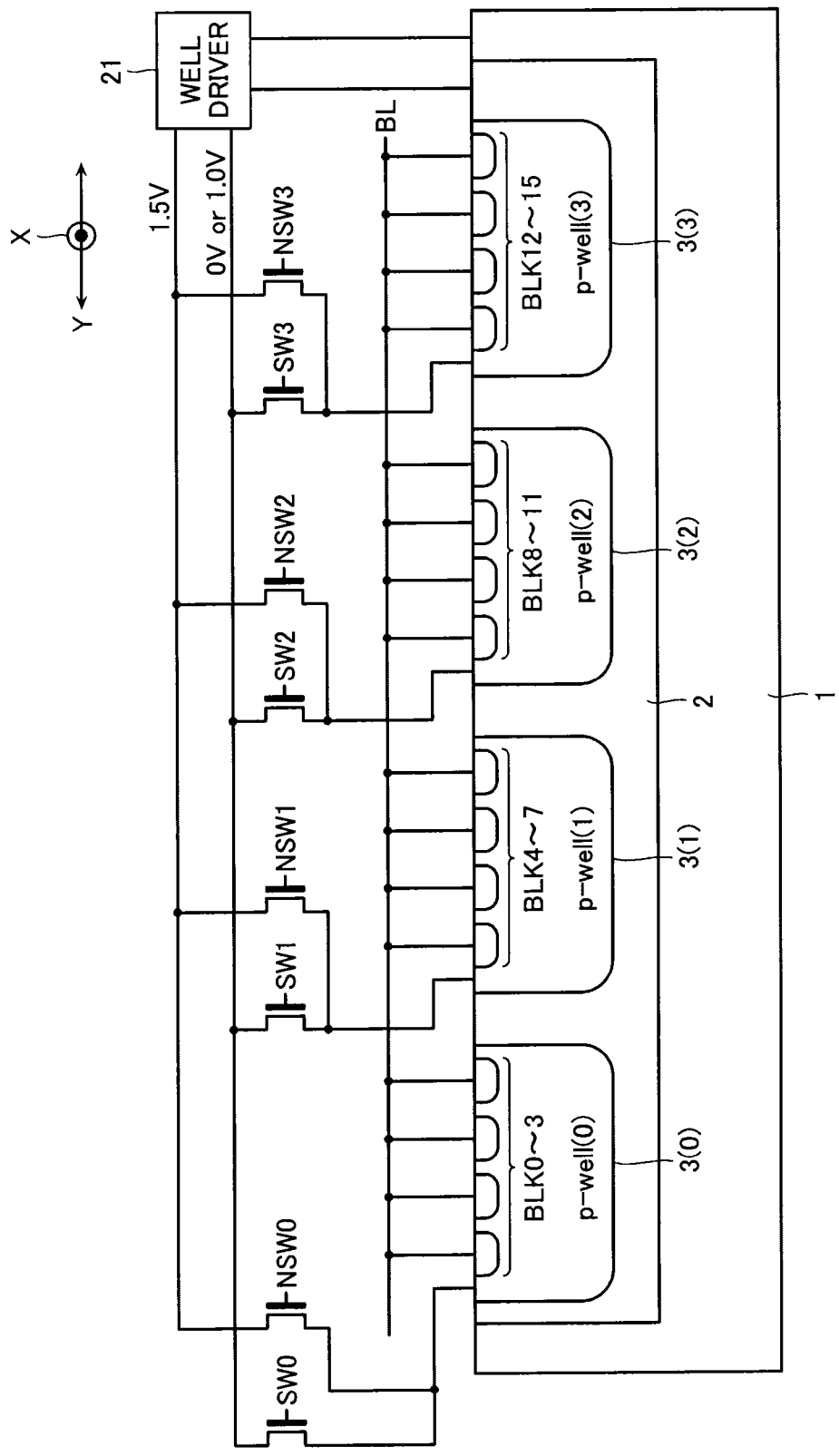
FIG. 4 is a schematic cross-sectional view of a memory cell array 11.

FIG. 4 shows a schematic cross-sectional view of the memory cell array 11. The memory cell array 11 is formed on a N-type well 2 formed on a P-type semiconductor substrate 1. Further, the N-type well 2 has a plurality of (four in FIG. 4) P-type wells 3 (0) to 3 (3) formed in its upper portion. The memory cell array 11 in this embodiment is formed on the P-type wells 3 (0) to 3 (3).

Each of the four P-type wells 3 (0) to 3 (3) includes four memory blocks BLK formed therein. For example, the N-type well 2 corresponds to one plane. In the conventional technologies, one plane includes one P-type well. In contrast, in this embodiment, one plane includes a plurality of P-type wells 3 (0) to 3 (3). In other words, one P-type well in the conventional technologies is divided into a plurality of wells.

The four P-type wells 3 (0) to 3 (3) are independently voltage controlled by the above well driver 21. Specifically, the P-type well 3 that includes a memory block BLK where the read operation is performed is provided with a voltage lower than the voltage provided to the bit line BL (for example, 1.5 V) by the well driver 21. For example, the voltage is the ground potential Vss (0V) or 1 V. In contrast, the P-type well 3 in which the read operation is not performed is provided with a voltage generally the same as the voltage provided to the bit line BL (for example, 1.5 V).

Figure 5:
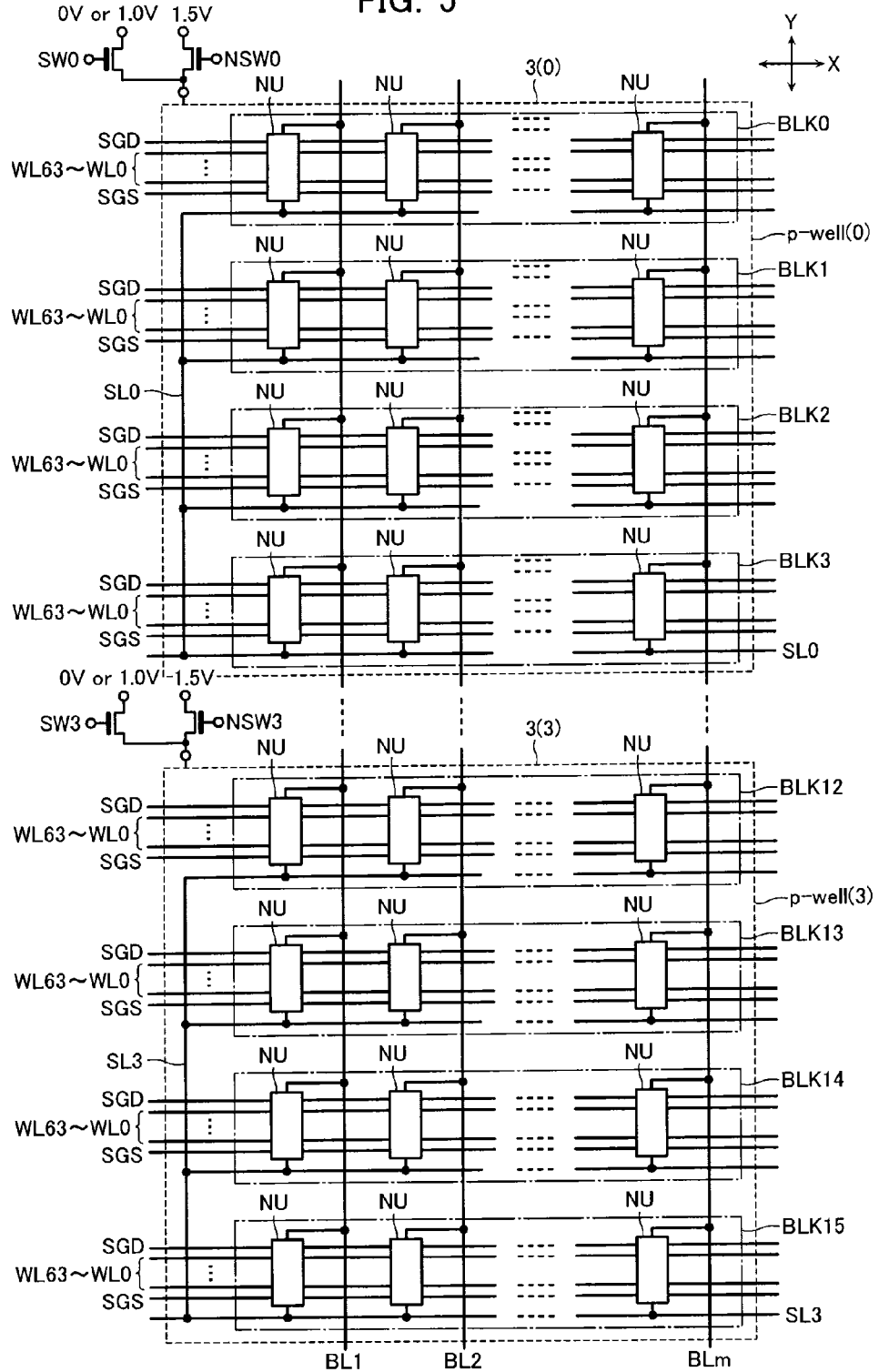
FIG. 5 is a schematic plan view of the memory cell array 11.

Note that with reference to FIG. 5, the four memory blocks BLK0 to BLK3 formed in the P-type well 3(0) are commonly connected to a source line SL0. Similarly, the four memory blocks BLK4 to BLK7 formed in the P-type well 3 (1) are commonly connected to a source line SL1. Furthermore, the four memory blocks BLK8 to BLK11 formed in the P-type well 3 (2) are commonly connected to a source line SL2. Similarly, the four memory blocks BLK12 to BLK15 formed in the P-type well 3 (3) are commonly connected to a source line SL3.

Furthermore, each bit line BL is commonly connected to the memory cell units MU adjacent in the y-direction in FIG. 5. In other words, each bit line BL commonly connects the memory cell units MU arranged in the blocks BLK0 to BLK15.

Figure 6:
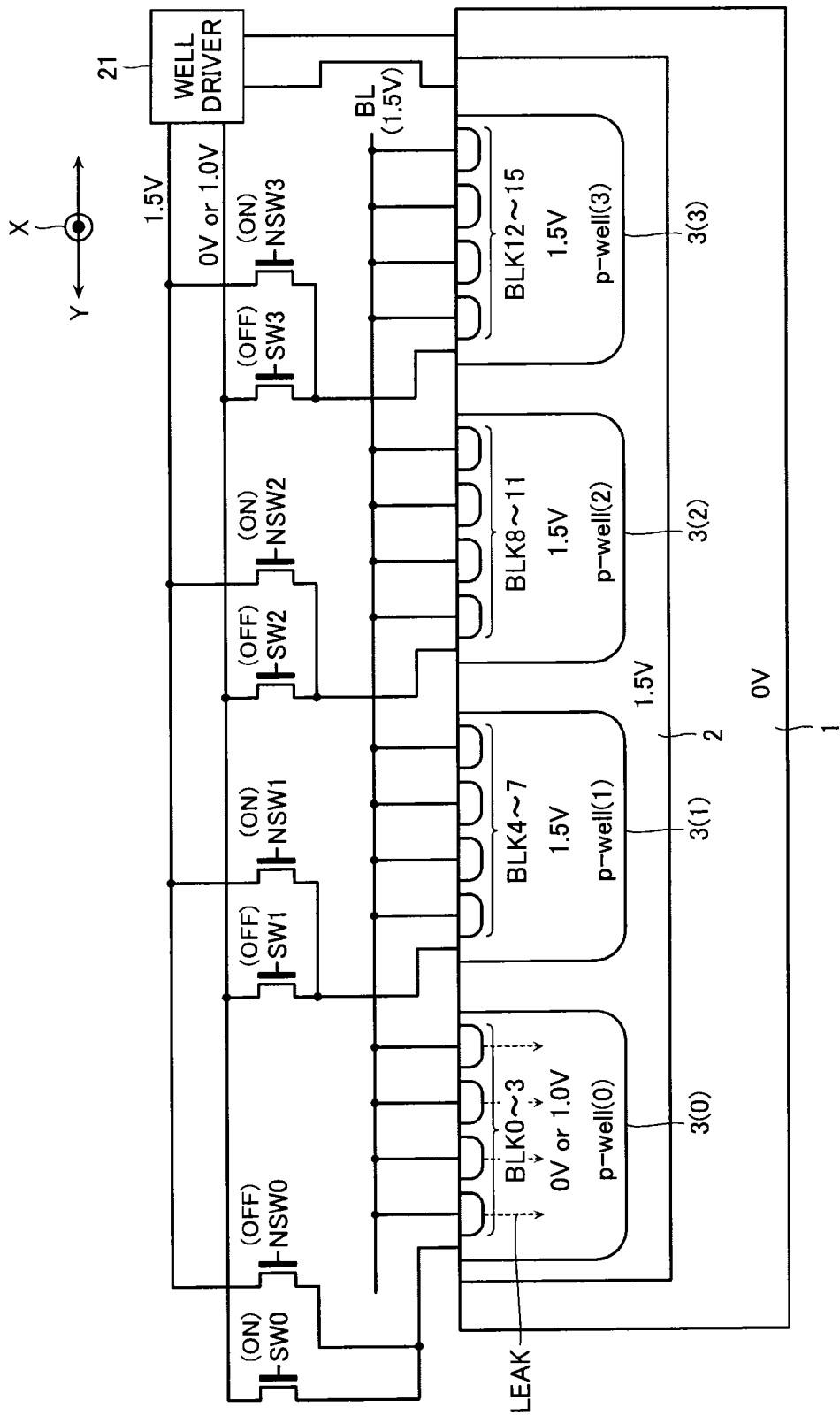
FIG. 6 is a schematic view showing an operation of a NAND flash memory according to an embodiment.

Referring now to FIG. 6 and FIG. 7, the read operation of the non-volatile semiconductor memory device according to the embodiment will be described. An example is considered here where a memory cell MC along any word line WL in the memory block BLK0 is selected.

When performing the read operation, first, according to an externally supplied block address, one memory block BLK (for example, the memory block BLK0) is selected. Then, a memory cell MCs along one selected word line WLs in the selected memory block BLK is selected as a selected memory cell. Here, the P-type well 3 (0) including the selected memory block BLK may be referred to as a read target well 3 (0) (a selected well). Similarly, the P-type wells 3 (1) to 3 (3) not including the selected memory block BLK may be referred to as non-read target wells 3 (1) to 3 (3) (non-selected wells). In this case, as shown in FIG. 6, the well driver 21 controls an associated transfer transistor to supply the read target P-type well 3 (0) with a voltage 0 V or 1.0 V. This voltage is a voltage lower than the voltage provided to the bit line BL during the read operation (1.5 V). Here, two types of voltages are provided (for example 0 V and 1.0 V), to allow for the so-called negative sense read in reading a threshold voltage distribution having low voltage values.

In contrast, the well driver 21 supplies the non-read target P-type wells 3 (1) to 3 (3) with a voltage (for example 1.5 V) generally the same as the voltage provided to the bit line BL (1.5 V). Note that the well driver 21 supplies, during the read operation, a voltage (for example 1.5 V) higher than the voltage provided to the read target P-type well 3 (0) to the N-type well 2. Additionally, the P-type semiconductor substrate 1 is provided with a voltage, such as the ground voltage Vss (0 V), lower than the voltage of the N-type well 2.

Figure 7A:
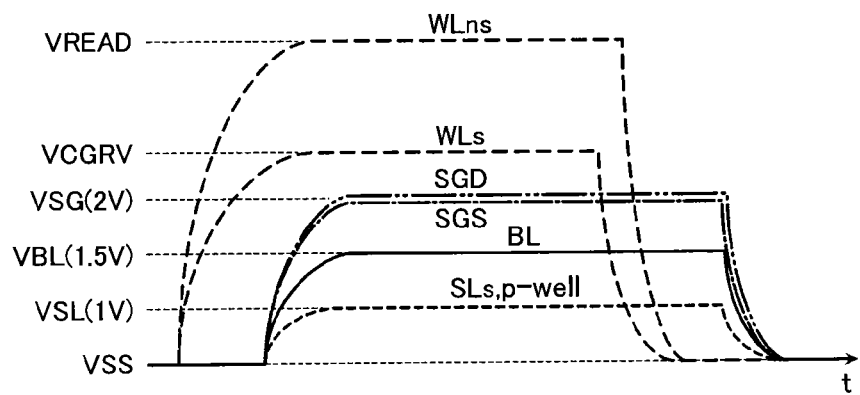
FIG. 7A is a waveform chart showing an operation of a NAND flash memory according to an embodiment.

With reference to FIG. 7A, the row decoder 12 applies a voltage VCGRV to the selected word line WLs connected to the selected memory cell MCs in the memory block BLK0. The voltage VCGRV is a voltage approximately corresponding to the midpoint of a plurality of threshold voltage distributions of the memory cell MC (if one memory cell MTr stores multi-bit data, the voltage VCGRV may take a plurality of values).

In contrast, the row decoder 12 applies a read-pass voltage VREAD to the non-selected word line WLns connected to the memory cell MC (the non-selected memory cell MCns) other than the selected memory cell MCs. Further, the read-pass voltage VREAD is a voltage that may render the memory cell MC conductive regardless of data held in the memory cell MC. The read-pass voltage VREAD is about 6 V to 8 V, for example.

Further, the row decoder 12 applies a voltage VSG (about 2 V) to each of the drain-side select gate line SGD and the source-side select gate line SGS. The voltage VSG is a voltage for rendering conductive the drain-side select gate transistor S1 and the source-side select transistor S2.

Then, the data control circuit 14 applies a voltage VBL (about 1.5 V) to the bit lines BL connected to the NAND cell unit NU including the selected memory cell MCs. In contrast, the source line driver 22 applies a voltage VSL (about 1.0 V) lower than the voltage VBL to the source line SL (the selected source line SLs (in this example, SL0)) connected to the NAND cell unit NU including the selected memory cell MCs.

Such a voltage application causes the NAND cell unit NU including the selected memory cell MCs to perform the following read operation. Specifically, if the selected memory cell MCs has a threshold voltage higher than the voltage VCGRV, the selected memory cell MCs is not conductive. Thus, the potential of the bit line BL does not decrease, but maintains the voltage VBL (1.5 V). In contrast, if the selected memory cell MCs has a threshold voltage equal to or lower than the voltage VCGRV, the selected memory cell MCs is conductive, thus reducing the potential of the bit line BL to the voltage VSL (1 V). The amount of the above bit line BL potential variation may be detected by the sense amplifier circuit 3 to determine data stored in the selected memory cell MCs.

Note that in the other memory blocks BLK1 to BLK3 in the P-type well 3 in which the selected memory block BLK is present, the row decoder 12 and the column decoder 13 maintain the voltages of the word line WL and the select gate lines SGD and SGS at 0 V. Similarly, in the non-read target wells 3 (1) to 3 (3), the voltages of the word line WL and the select gate lines SGD and SGS are maintained at 0 V. Thus, the drain-side select transistor SDTr and the source-side select transistor SSTr are maintained non-conductive. However, any potential difference between the bit line BL and the well 3 will cause a leak current flow. The bit line BL may thus reduce its potential. As a result, a larger leak current leads to a lower read margin of the sense amplifier circuit 3, which may contribute to the false reading. Therefore, this embodiment controls the voltages of the P-type wells 3 (0) to 3 (3) as follows.

Figure 7B:
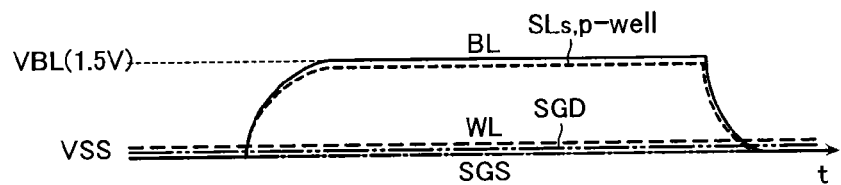
FIG. 7B is a waveform chart showing an operation of a NAND flash memory according to an embodiment.

With reference to FIG. 7B, a description is given of voltages applied to the memory blocks BLK4 to BLK15 (non-selected) present in the non-read target P-type wells 3 (1) to 3 (3).

The memory cell units NU in the memory blocks BLK4 to BLK15 share the bit lines BL with the memory cell units MU disposed in the read target memory block BLK0. In other words, the voltages applied to the bit lines BL connected to the memory cell units NU in the memory blocks BLK4 to BLK15 are the same as the voltage (1.5 V) applied to the bit lines connected to the NAND cell units NU including the selected memory cell MCs.

However, the P-type wells 3 (0) to 3 (3) are independently formed and their voltages are independently controlled. In the read operation in this embodiment, the non-read target P-type wells 3 (1) to 3 (3) are provided with the same voltage of 1.5 V as is provided to the bit line BL. This may hardly generate any leak due to the potential difference between the bit line BL and the non-read target P-type wells 3 (1) to 3 (3). As a result, the potential reduction of the bit line BL may be prevented.

Further, the N-type well 2 is provided with the same voltage (for example, 1.5 V) as is provided to the P-type wells 3 (1) to 3 (3). Thus, potential difference does not occur between the N-type well 2 and the P-type wells 3 (1) to 3 (3). As a result, almost leak current dose not flow from the P-type wells 3 (1) to 3 (3) to the N-type well 2. This may limit the voltage drop of the P-type wells 3 (1) to 3 (3) and may prevent the increased potential difference between the bit line BL and the P-type wells 3 (1) to 3 (3). The power consumption may also be reduced. The source line driver 22 applies a voltage VBL to the source lines of the un-selected condition (in this example SL1,SL2,SL3).

Note that the P-type semiconductor substrate 1 is preferably provided with the ground potential Vss (0V). This is because the P-type semiconductor substrate 1 has a variety of circuit devices disposed thereon. If a voltage applied to the P-type semiconductor substrate 1 is changed, it leads to a change of the operation characteristics of the circuit devices.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, the number of memory blocks BLK disposed in the P-type well 3 may be one. Even in this case, the voltage control of the P-type well 3 may effectively prevent the misread. Further, during the read operation, the voltages applied to the non-read target P-type wells 3 (1) to 3 (3) may not be the same as the voltages applied to the bit line BL. If the potential difference between the non-read target P-type wells 3 (1) to 3 (3) and the bit lines BL is at least smaller than the potential difference between the read target P-type well 3 (0) and the bit line BL, the misread may be effectively limited.

What is claimed is:

1. A non-volatile semiconductor memory device comprising:
   a semiconductor layer of a first conductivity type;
   a plurality of first wells of a second conductivity type formed on the first semiconductor layer, the first wells being arranged in a first direction;
   a plurality of memory blocks arranged in each of the first wells, each memory block comprising a plurality of NAND cell units arranged therein, each NAND cell unit including a plurality of memory cells and select transistors connected in series;
   a plurality of word lines, each word line being commonly connected to the NAND cell units in one memory block;
   a plurality of bit lines extending in the first direction, each bit line being connected to first ends of the NAND cell units in the memory blocks, and commonly connected across the plurality of first wells;
   a source line connected to second ends of the NAND cell units; and
   a well driver adapted to be capable of independently controlling potentials of the first wells.

2. The non-volatile semiconductor memory device according to claim 1, wherein the well driver selectively provides a first voltage or a second voltage to each of the wells, the second voltage being higher than the first voltage, the second voltage being generally the same as a bit line voltage provided to the bit lines during a read operation.

3. The non-volatile semiconductor memory device according to claim 2, wherein
the well driver performs a control of applying the first voltage to a selected first well of the first wells in which a selected NAND cell unit is disposed, and applying the second voltage to at least one first well of the first wells except the selected first well.

4. The non-volatile semiconductor memory device according to claim 3, wherein
the semiconductor layer is provided with the second voltage during the read operation.

5. The non-volatile semiconductor memory device according to claim 1, wherein
each of the bit lines is commonly connected to the NAND cell units each arranged in the respective blocks.

6. The non-volatile semiconductor memory device according to claim 1, wherein
the well driver performs a control of applying a first voltage to a selected first well of the first wells in which a selected NAND cell unit is disposed, and applying a second voltage to at least one first well of the first wells except the selected first well, the second voltage being higher than the first voltage.

7. The non-volatile semiconductor memory device according to claim 6, wherein
the semiconductor layer is provided with the second voltage during a read operation.

8. The non-volatile semiconductor memory device according to claim 1,
wherein the semiconductor layer is formed on a semiconductor substrate of a second conductivity type.

9. A non-volatile semiconductor memory device comprising:
a semiconductor layer of a first conductivity type;
a plurality of first wells of a second conductivity type formed on the first semiconductor layer;
a plurality of memory blocks arranged in each of the first wells, each memory block comprising a plurality of NAND cell units arranged therein, each NAND cell unit including a plurality of memory cells and select transistors connected in series;
a plurality of word lines, each word line being commonly connected to the NAND cell units in one memory block;
a plurality of bit lines, each bit line being connected to first ends of the NAND cell units in the memory blocks, and commonly connected across the plurality of first wells;
a source line connected to second ends of the NAND cell units; and
a well driver adapted to be capable of independently controlling potentials of the first wells;
wherein the well driver performs a control of applying the first voltage to a selected first well of the first wells in which a selected NAND cell unit is disposed, and applying the second voltage to at least one first well of the first wells except the selected first well.

10. The non-volatile semiconductor memory device according to claim 9, wherein
the semiconductor layer is provided with the second voltage during the read operation.

11. The non-volatile semiconductor memory device according to claim 9, wherein
each of the bit lines is commonly connected to the NAND cell units each arranged in the respective blocks.

* * * * *